United States Patent
Ikeda et al.

(10) Patent No.: US 8,945,342 B2
(45) Date of Patent: Feb. 3, 2015

(54) SURFACE WAVE PLASMA GENERATING ANTENNA AND SURFACE WAVE PLASMA PROCESSING APPARATUS

(75) Inventors: Taro Ikeda, Nirasaki (JP); Shigeru Kasai, Nirasaki (JP); Yuki Osada, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 156 days.

(21) Appl. No.: 13/410,957

(22) Filed: Mar. 2, 2012

(65) Prior Publication Data

US 2012/0222816 A1    Sep. 6, 2012

(30) Foreign Application Priority Data

Mar. 2, 2011 (JP) ................................ 2011-045413

(51) Int. Cl.
- C23C 16/00 (2006.01)
- C23F 1/00 (2006.01)
- H01L 21/306 (2006.01)
- H01J 37/32 (2006.01)
- C23C 16/27 (2006.01)

(52) U.S. Cl.
CPC ........... H01J 37/3222 (2013.01); C23C 16/274 (2013.01)
USPC .............................. 156/345.41; 118/723 MW (58) Field of Classification Search
CPC ........................... H01J 37/3222; C23C 16/274
USPC ............................... 156/345.41; 118/723 MW
See application file for complete search history.

(56) References Cited

U.S. PATENT DOCUMENTS

| | | |
|---|---|---|
| 2002/0020498 A1* | 2/2002 | Ohmi et al. .................. 156/345 |
| 2002/0111000 A1 | 8/2002 | Kawakami et al. |
| 2005/0090078 A1 | 4/2005 | Ishihara |
| 2006/0005929 A1 | 1/2006 | Ishii et al. |
| 2008/0053816 A1 | 3/2008 | Suzuki et al. |
| 2009/0159214 A1 | 6/2009 | Kasai |
| 2009/0194236 A1 | 8/2009 | Ono et al. |
| 2009/0211708 A1* | 8/2009 | Matsumoto et al. ..... 156/345.41 |
| 2011/0061814 A1 | 3/2011 | Ikeda |

FOREIGN PATENT DOCUMENTS

| | | |
|---|---|---|
| EP | 1 895 565 A1 | 3/2008 |
| JP | H03-191074 | 8/1991 |
| JP | 2000-294550 | 10/2000 |
| JP | 2005-129666 | 5/2005 |
| JP | 2009-224493 | 10/2009 |
| JP | 2011-29416 A | 2/2011 |

OTHER PUBLICATIONS

Extended European Search Report issued Jun. 19, 2012 in Patent Application No. 12157889.2.

* cited by examiner

Primary Examiner — Rakesh Dhingra
(74) Attorney, Agent, or Firm — Oblon, Spivak, McClelland, Maier & Neustadt, L.L.P.

(57) ABSTRACT

A surface wave plasma generating antenna serves to generate a surface wave plasma in a chamber by radiating into the chamber a microwave transmitted from a microwave output section through a coaxial waveguide including an outer conductor and an inner conductor. The surface wave plasma generating antenna is formed in a planar shape and has a plurality of slots arranged in a circumferential direction, and each joint portion between two adjacent slots in the circumferential direction is overlapped with at least one of the slots in a diametrical direction.

14 Claims, 10 Drawing Sheets

SURFACE WAVE PLASMA GENERATING ANTENNA AND SURFACE WAVE PLASMA PROCESSING APPARATUS

CROSS-REFERENCE TO RELATED APPLICATIONS

This application claims priority to Japanese Patent Application No. 2011-045413 filed on Mar. 2, 2011, the entire contents of which are incorporated herein by reference.

FIELD OF THE INVENTION

The present invention relates to a surface wave plasma generating antenna and a surface wave plasma processing apparatus.

BACKGROUND OF THE INVENTION

A plasma processing is a technique indispensable to the manufacture of semiconductor devices. Recently, a design rule for semiconductor devices constituting an LSI becomes further miniaturized in order to comply with a demand for high-integration and high-speed of LSI, and a semiconductor wafer grows in size. Accordingly, a plasma processing apparatus is required to cope with the miniaturization and the size growth.

In case of a parallel plate plasma processing apparatus or an inductively-coupled plasma processing apparatus which has been widely used, plasma damage may occur in a fine-size device due to a high temperature of electrons of a plasma. Further, since a plasma density is kept high only in a limited region, it is difficult to uniformly plasma-process a large-size semiconductor wafer at a high speed.

Therefore, some attention has been paid to a RLSA (Radial Line Slot Antenna) microwave plasma processing apparatus capable of uniformly generating a plasma in a high density and at a low electron temperature (see, e.g., Japanese Patent Application Publication No. 2000-294550). The RLSA microwave plasma processing apparatus includes, as a surface wave plasma generating antenna, a planar antenna (a radial line slot antenna) provided at an upper portion of a chamber, the planar antenna having a plurality of slots formed in a predetermined pattern. In this type of plasma processing apparatus, a microwave generated from a microwave generator passes through the slots of the planar antenna and is radiated into a vacuum chamber through a dielectric microwave transmitting plate provided below the planar antenna. By a thus-produced microwave electric field, a surface wave plasma is generated in the chamber and, thus, a target object, e.g., a semiconductor wafer, to be processed is processed by the plasma.

As for the planar antenna used as the surface wave plasma generating antenna, there is known a planar antenna in which a plurality of, e.g., four, arc-shaped slots is uniformly arranged in a circumferential direction as described in Japanese Patent Application Publication No. 2009-224493 (JP2009-224493A).

However, in the case of using the planar antenna having a plurality of arc-shaped slots uniformly arranged in a circumferential direction as described in JP2009-224493A, the intensity of the electromagnetic wave is decreased at portions where no openings are formed between the slots and the plasma density is also decreased in proportion to the area of that portions. This results in deterioration of the plasma uniformity in the circumferential direction (angular direction).

SUMMARY OF THE INVENTION

In view of the above, the present invention provides a surface wave plasma generating antenna and a surface wave plasma processing apparatus, capable of generating a uniform surface wave plasma.

In accordance with an aspect of the present invention, there is provided a surface wave plasma generating antenna for generating a surface wave plasma in a chamber by radiating into the chamber a microwave transmitted from a microwave output section through a coaxial waveguide including an outer conductor and an inner conductor. The surface wave plasma generating antenna is formed in a planar shape and has a plurality of slots arranged in a circumferential direction, and each joint portion between two adjacent slots in the circumferential direction is overlapped with at least one of the slots in a diametrical direction.

In accordance with an aspect of the present invention, there is provided a surface wave plasma generating apparatus including a chamber for accommodating therein a substrate to be processed; a gas supply mechanism for supplying a gas into the chamber; and a microwave plasma source for generating a surface wave plasma of the gas into the chamber by introducing a microwave into the chamber, the microwave plasma source including a microwave output section having a microwave power supply, for outputting a generated microwave; and a microwave introducing mechanism for introducing the outputted microwave into the chamber. The microwave introducing mechanism includes a coaxial waveguide having an outer conductor and an inner conductor; and the surface wave plasma generating antenna for radiating the microwave transmitted through the waveguide into the chamber.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Hereinafter, embodiments of the present invention will be described in detail with reference to the accompanying drawings which form a part hereof.

(Configuration of Surface Wave Plasma Processing Apparatus)

Figure 1:
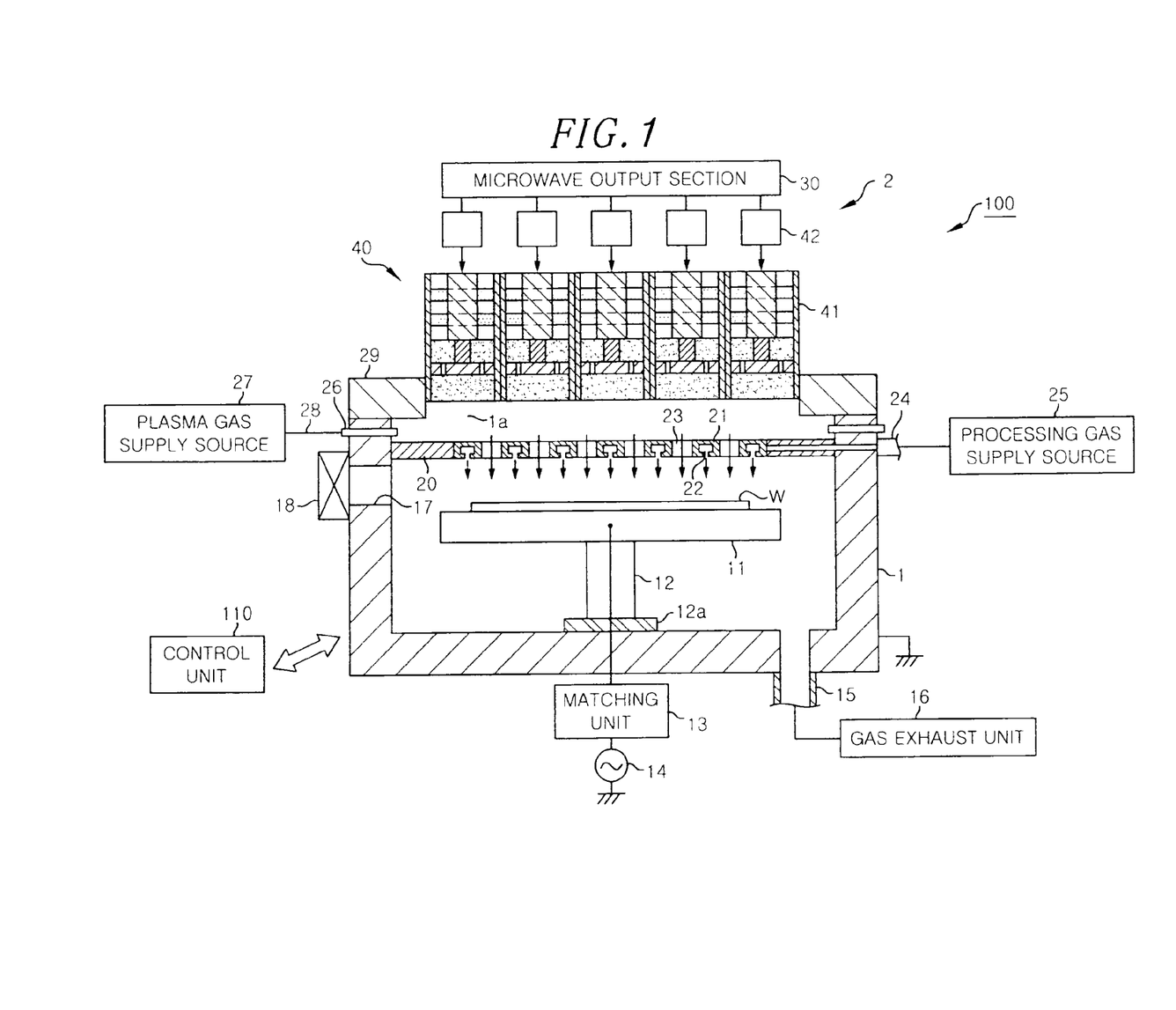
FIG. 1 is a cross sectional view showing a schematic configuration of a surface wave plasma processing apparatus having a surface wave plasma generating antenna in accordance with embodiments of the present invention.

A surface wave plasma processing apparatus 100 is configured as, e.g., a plasma etching apparatus for performing on a wafer an etching process as a plasma process, and includes a substantially cylindrical airtight chamber 1 made of a metal such as aluminum, stainless steel or the like, the chamber 1 being grounded; and a microwave plasma source 2 for generating a microwave plasma in the chamber 1. An opening 1a is formed at an upper portion of the chamber 1, and the microwave plasma source 2 is disposed so as to face the inside of the chamber 1 through the opening 1a.

Within the chamber 1, a susceptor 11 for horizontally supporting a wafer W as a target object to be processed is supported by a cylindrical support member 12 extended upwardly from a bottom center of the chamber 1 via an insulating member 12a. The susceptor 11 and the support member 12 may be made of, e.g., aluminum having an alumite-processed (anodically oxidized) surface.

Although they are not illustrated, the susceptor 11 is provided with an electrostatic chuck for electrostatically attract the wafer W; a temperature control mechanism, a gas channel for supplying a heat transfer gas to a backside of the wafer W; elevation pins which are raised and lowered to transfer the wafer W; and the like. A high frequency bias power supply 14 is electrically connected to the susceptor 11 via a matching unit 13. By supplying a high frequency power from the high frequency bias power supply 14 to the susceptor 11, ions in the plasma are attracted toward the wafer W.

A gas exhaust line 15 is connected to a bottom portion of the chamber 1, and a gas exhaust unit 16 including a vacuum pump (not shown) is connected to the gas exhaust line 15. By operating the gas exhaust unit 16, the chamber 1 can be exhausted and depressurized to a predetermined vacuum level at a high speed. Provided at a sidewall of the chamber 1 are a loading/unloading port 17 for loading and unloading the wafer W and a gate valve 18 for opening and closing the loading/unloading port 17.

A shower plate 20 for injecting a processing gas, i.e., a plasma etching gas, toward the wafer W is horizontally provided above the susceptor 11 in the chamber 1. The shower plate 20 has lattice-shaped gas channels 21 and a plurality of gas injection holes 22 formed at the gas channels 21. Space portions 23 are defined between the lattice-shaped gas channels 21. A line 24 extending to the outside of the chamber 1 is connected to the gas channels 21 of the shower plate 20, and a processing gas supply source 25 is connected to the line 24.

Meanwhile, a ring-shaped plasma gas introducing member 26 is provided above the shower plate 20 of the chamber 1 along the wall of the chamber, and a plurality of gas injection holes are formed in an inner circumferential portion of the plasma gas introducing member 26. A plasma gas supply source 27 for supplying a plasma gas is connected to the plasma gas introducing member 26 via a line 28. As for the plasma gas, Ar gas or the like is preferably used.

The plasma gas introduced into the chamber 1 from the plasma gas introducing member 26 is turned into a plasma by the microwave introduced into the chamber 1 from the microwave plasma source 2. The processing gas injected through the gas injection holes 22 of the shower plate 20 is excited by the plasma passing through the space portions 23 of the shower plate 20 to thereby generate a plasma of the processing gas.

Figure 2:
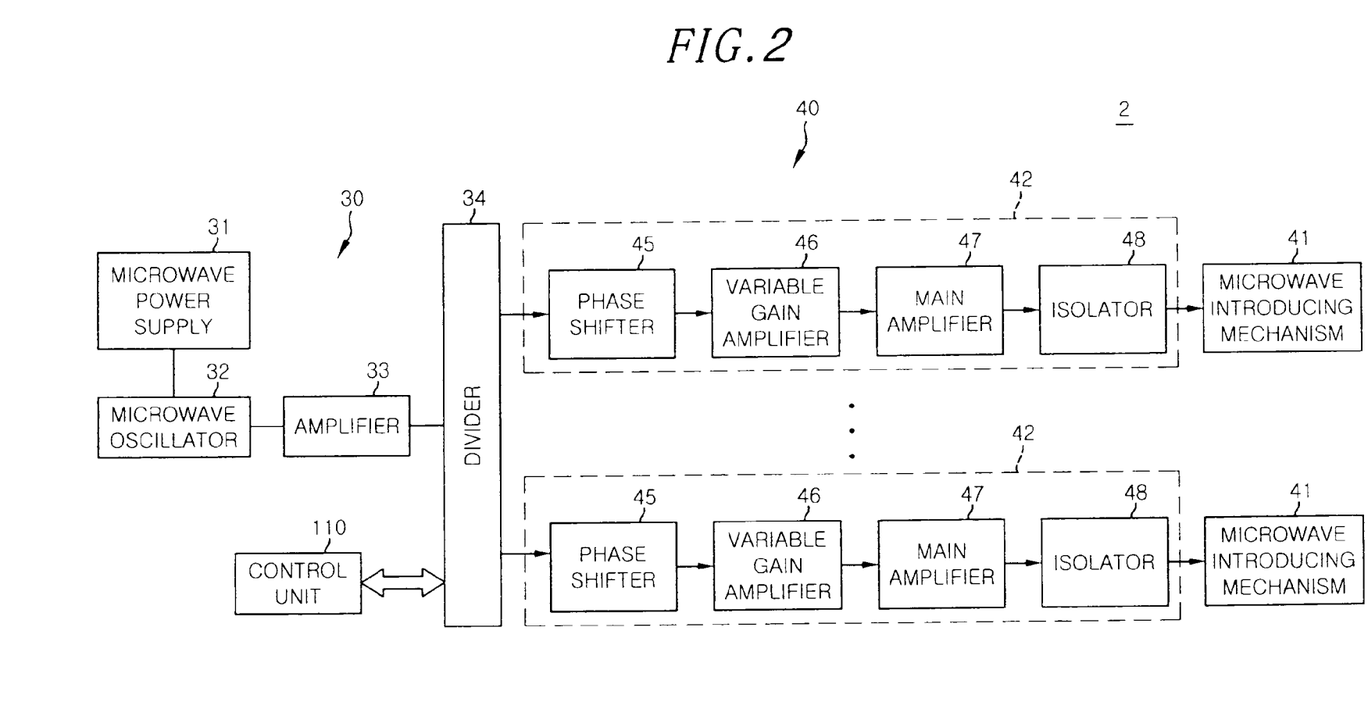
FIG. 2 shows a configuration of a microwave plasma source employed in the surface wave plasma processing apparatus shown in FIG. 1.

The microwave plasma source 2 is held by a support ring 29 provided at an upper portion of the chamber 1, and a space therebetween is airtightly sealed. As shown in FIG. 2, the microwave plasma source 2 includes a microwave output section 30 for dividedly outputting microwaves through a plurality of channels; and a microwave supply unit 40 for transmitting the microwave outputted from the microwave output section 30 and radiating it to the chamber 1.

The microwave output section 30 has a microwave power supply 31; a microwave oscillator 32; an amplifier 33 for amplifying an oscillated microwave; and a divider 34 for dividing the amplified microwave into a plurality of microwaves.

The microwave oscillator 32 performs, e.g., PLL (Phase Locked Loop) oscillation, to generate a microwave of a predetermined frequency (e.g., 915 MHz). The divider 34 divides the microwave amplified by amplifier 33 while matching the impedance between an input side and an output side such that the loss of the microwave can be minimized. The frequency of the microwave raging from 700 MHz to 3 GHz may be used in addition to 915 MHz.

The microwave supply unit 40 has a plurality amplifier sections 42 for mainly amplifying the divided microwaves and microwave introducing mechanisms 41 which are respectively connected to the amplifier sections 42.

Each of the amplifier sections 42 has a phase shifter 45, a variable gain amplifier 46, a main amplifier 47 constituting a solid state amplifier, and an isolator 48.

The phase shifter 45 is configured to shift phases of the microwaves, and the radiation characteristics can be modulated by controlling the phase shifter 45. For example, the directivity can be controlled by adjusting the phase in each of the antenna modules to thereby change the plasma distribution, and the circularly polarized waves can be obtained by shifting the phase by about 90° between adjacent antenna modules. Further, the phase shifter 45 can be used to control delay characteristics between components in the amplifier and to perform spatial combination in the tuner. However, the phase shifter 45 may not be provided when it is unnecessary to modulate the radiation characteristics or control the delay characteristics between the components in the amplifier.

The variable gain amplifier 46 serves to adjust the variation in the antenna modules or the plasma intensity by controlling power levels of the microwaves inputted to the main amplifier 47. By controlling the variable gain amplifier 46 for each of the antenna modules, it is possible to variably adjust the distribution of the generated plasma.

The main amplifier 47 constituting the solid state amplifier may have, e.g., an input matching circuit; a semiconductor amplifying device; an output matching circuit; and a high Q resonant circuit.

The isolator 48 serves to separate the microwave reflected by the microwave introducing mechanism 41 toward the main amplifier 47 and has a circulator and a dummy load (coaxial terminator). The circulator guides the microwave reflected by an antenna unit 43, which will be described later, to the dummy load; and the dummy load converts the reflected microwave guided by the circulator into heat.

Figure 3:
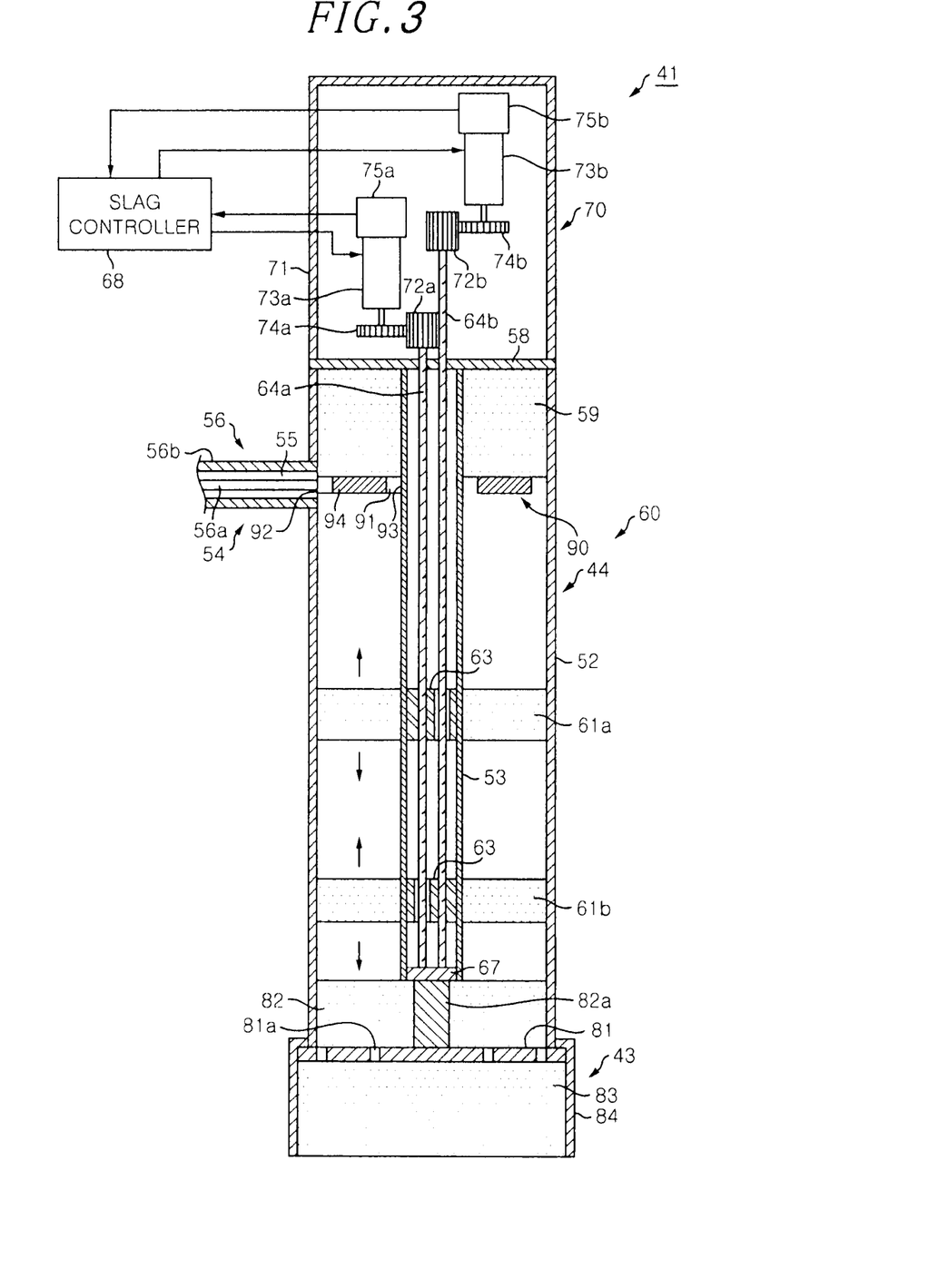
FIG. 3 is a vertical cross sectional view showing a microwave introducing mechanism in the surface wave plasma processing apparatus shown in FIG. 1.
Figure 4:
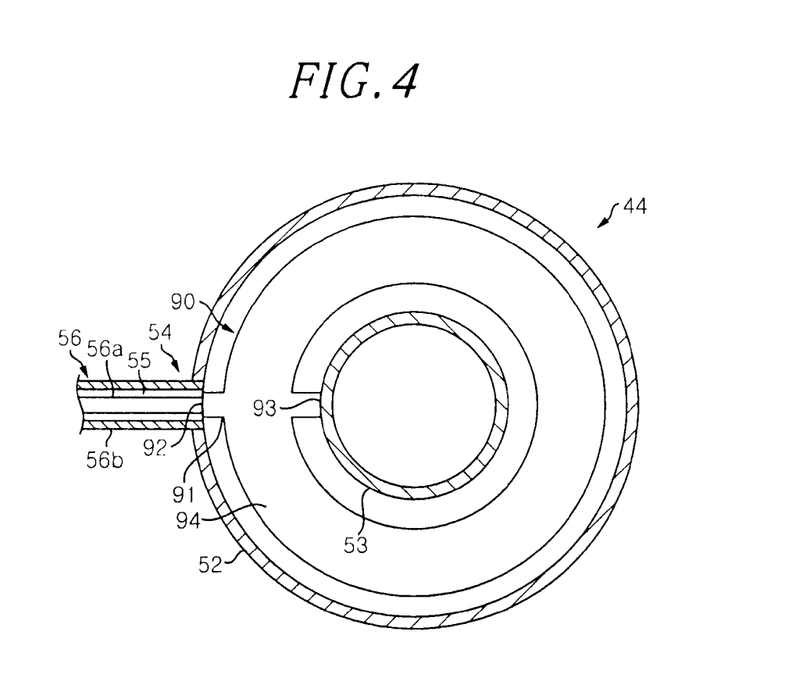
FIG. 4 is a horizontal cross sectional view showing a power supply mechanism of the microwave introducing mechanism.

As shown in the vertical cross sectional view of FIG. 3 and the horizontal cross sectional view of FIG. 4, the microwave introducing mechanism 41 has a coaxial waveguide 44 for transmitting the microwaves; and the antenna unit 43 for radiating the microwaves transmitted through the waveguide 44 into the chamber 1. The microwaves radiated into the chamber 1 from the microwave introducing mechanism 41 are combined in the space in the chamber 1 to thereby generate a surface wave plasma in the chamber 1.

The waveguide 44 includes a cylindrical outer conductor 52; and a rod-shaped inner conductor 53 coaxially arranged within the cylindrical outer conductor 52, and the antenna unit 43 is provided at an end portion of the waveguide 44. In the waveguide 44, the inner conductor 53 is used for power supply, and an outer conductor 52 is used for a ground. A reflecting plate 58 is provided at the upper ends of the outer conductor 52 and the inner conductor 53.

A power supply mechanism 54 for supplying a microwave (electromagnetic wave) is provided at a base end side of the waveguide 44. The power supply mechanism 54 includes a microwave power introduction port 55 provided at a side surface of the waveguide 44 (outer conductor 52) to introduce a microwave power. Connected to the microwave power introduction port 55 is a coaxial cable 56 including an inner conductor 56a and an outer conductor 56b which serves as a power supply line for supplying the microwave amplified by the amplifier section 42. A power supply antenna 90 extending horizontally toward the inside of the outer conductor 52 is connected to a leading end of the inner conductor 56a of the coaxial cable 56.

The power supply antenna 90 is formed by cutting a metal plate made of, e.g., aluminum, and fitting the metal plate into a frame of a dielectric member made of Teflon (Registered Trademark) or the like. A wave retardation member 59 made of a dielectric material such as Teflon (Registered Trademark) is provided between the reflecting plate 58 and the power supply antenna 90 in order to shorten an effective wavelength of a reflection wave.

In the case of using a microwave with a high frequency of, e.g., 2.45 GHz, the wave retardation member 59 may not be provided. At this time, a maximum electromagnetic wave is transmitted into the coaxial waveguide 44 by reflecting an electromagnetic wave radiated from the power supply antenna 90 on the reflecting plate 58. In that case, a distance from the power supply antenna 90 to the reflecting plate 58 is substantially a multiple of a half wavelength of $\lambda g/4$. However, this may not be applied to a microwave with a low frequency due to limit in the diametrical direction. In that case, it is preferable to optimize a shape of the power supply antenna 90 such that an antinode of an electromagnetic wave generated from the power supply antenna 90 is formed below the power supply antenna 90 without being formed at the power supply antenna 90.

As shown in FIG. 4, the power supply antenna 90 includes an antenna main body 91 having a first pole 92 connected to the inner conductor 56a of the coaxial cable 56 in the microwave power introduction port 55 and to which an electromagnetic wave is supplied and a second pole 93 for radiating the supplied electromagnetic wave; and a ring-shaped reflection portion 94 extending from both sides of the antenna main body 91 along the outer side of the inner conductor 53. The electromagnetic wave that is incident on the antenna main body 91 and the electromagnetic wave reflected by the reflection portion 94 are used to form a standing wave. The second pole 93 of the antenna main body 91 is brought contact into the inner conductor 53.

By radiating a microwave (electromagnetic wave) from the power supply antenna 90, a microwave power is supplied to a space between the outer conductor 52 and the inner conductor 53. The microwave power supplied to the power supply mechanism 54 propagates toward the antenna unit 43.

A tuner 60 is provided in the waveguide 44. The tuner 60 serves to match an impedance of a load (plasma) in the chamber 1 to a characteristic impedance of the microwave power supply in the microwave output section 30. The tuner 60 includes two slags 61a and 61b provided between the outer conductor 52 and the inner conductor 53, the two slags 61a and 61b being vertically movable; and a slag driving unit 70 provided at an outer side (upper side) of the reflecting plate 58.

The slag 61a is provided at the slag driving unit 70 side, and the slag 61b is provided at the antenna unit 43 side. Further, two slag moving shafts 64a and 64b used for moving the slags 61a and 61b which are formed of screw rods each having, e.g., a trapezoidal thread are provided in the inner space of the inner conductor 53 along the longitudinal direction.

Figure 5:
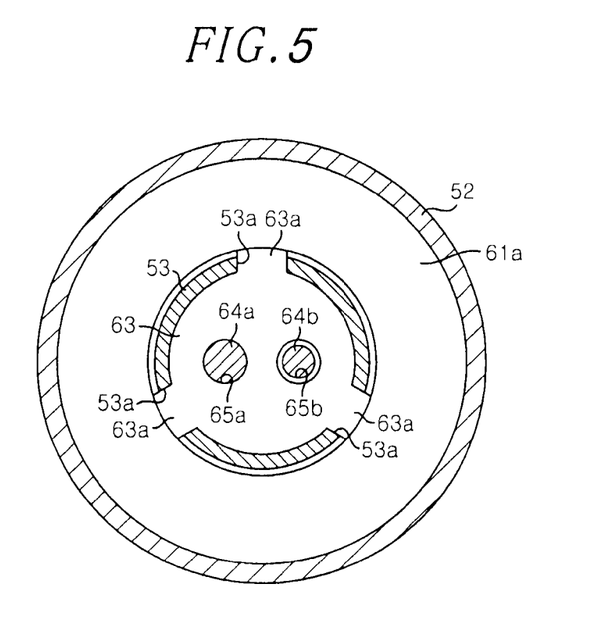
FIG. 5 is a plan view showing a slag and a sliding member in a main body of a tuner.

As shown in FIG. 5, the slag 61a made of a dielectric material has a circular ring shape, and a sliding member 63 made of a resin having a smoothness is inserted into the slag 61a. The sliding member 63 has a screw hole 65a to which the slag moving shaft 64a is screw-coupled; and a through hole 65b through which the slag moving shaft 64b is inserted.

Although the slag 61b has a screw hole 65a and a through hole 65b as in the case of the slag 61a, the screw hole 65a is screw-coupled to the slag moving shaft 64b and the slag moving shaft 64a is inserted through the through hole 65b unlike the case of the slag 61a. Accordingly, the slag 61a is vertically moved by rotating the slag moving shaft 64a, and the slag 61b is vertically moved by rotating the slag moving shaft 64b. In other words, the slags 61a and 61b are vertically moved by a screw mechanism including the slag moving shafts 64a and 64b and the sliding member 63.

Figure 6:
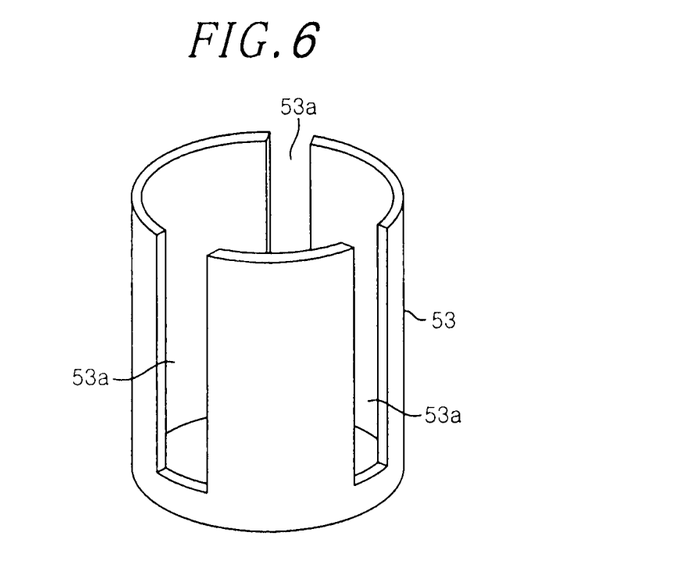
FIG. 6 is a perspective view showing an internal conductor in the main body of the tuner.

As shown in FIG. 6, three slits 53a are formed at the inner conductor 53 along the longitudinal direction thereof to be spaced apart from each other at a regular interval. Meanwhile, three protrusions 63a are provided at the sliding member 63 to be spaced apart from each other at a regular interval so as to correspond to the slits 53a. The sliding member 63 is fitted into the slags 61a and 61b in a state where the protrusions 63a are brought into contact with the inner circumferential portions of the slags 61a and 61b.

The outer circumferential surface of the sliding member 63 comes into contact with the inner circumferential surface of the inner conductor 53 without a clearance therebetween and, thus, the sliding member 63 is vertically moved while sliding along the inner conductor 53 by rotating the slag moving shafts 64a and 64b. In other words, the inner circumferential surface of the inner conductor 53 functions as a slide guide of the slags 61a and 61b. A width of the slits 53a is preferably set to about 5 mm or less. Hence, as will be described later, the microwave power leaking into the inner conductor 53 can be substantially eliminated, and the high radiation efficiency of the microwave power can be maintained.

As for a resin material of the sliding member 63, it is preferable to employ a relatively easily processible resin having a high smoothness, e.g., a polyphenylene sulfide (PPS) resin.

The slag moving shafts 64a and 64b extend through the reflecting plate 58 to the slag driving unit 70. A bearing (not shown) is provided between the slag moving shafts 64a and 64b and the reflecting plate 58. Further, a bearing 67 made of a conductor is provided at a lower end of the inner conductor 53, and the lower ends of the slag moving shafts 64a and 64b are rotatably supported by the bearing 67.

The slag driving unit 70 includes a housing body 71, and the slag moving shafts 64a and 64b are extended into the housing body 71. Gears 72a and 72b are attached to the upper ends of the slag moving shafts 64a and 64b. The slag driving unit 70 includes a motor 73a for rotating the slag moving shaft 64a; and a motor 73b for rotating the slag moving shaft 64b. The gear 74a is attached to a shaft of the motor 73a, and the gear 74b is attached to a shaft of the motor 73b. The gear 74a is engaged with the gear 72a, and the gear 74b is engaged with the gear 72b. Accordingly, the slag moving shaft 64a is rotated by the motor 73a via the gears 74a and 72a, and the slag moving shaft 64b is rotated by the motor 73b via the gears 74b and 72b. The motors 73a and 73b are, e.g., stepping motors.

The slag moving shaft 64b is longer than the slag moving shaft 64a and extends further upward than the slag moving shaft 64a. Therefore, the gears 72a and 72b are vertically offset from each other, and the motors 73a and 73b are vertically offset from each other. Hence, the space of the power transmission mechanism including the motors, the gears and the like can be reduced, and the housing body 71 accommodating such components can have the same diameter as that of the outer conductor 52.

Increment encoders 75a and 75b for detecting positions of the slags 61a and 61b are provided above the motors 73a and 73b so as to be directly coupled to output shafts thereof, respectively.

The positions of the slags 61a and 61b are controlled by a slag controller 68. Specifically, the slag controller 68 sends control signals to the motors 73a and 73b based on an impedance of the input terminal detected by an impedance detector (not shown) and position informations related to the slags 61a and 61b detected by the encoders 75a and 75b. Then, the impedance is adjusted by controlling the positions of the slags 61a and 61b. The slag controller 68 performs impedance matching such that an impedance of a terminal is adjusted to, e.g., about 50Ω. When only one of two slugs is moved, a trajectory passing through the origin of the smith chart is drawn. When both of the two slugs are moved, only the phase is rotated.

The antenna unit 43 includes a planar shaped surface wave plasma generating antenna 81 for generating a surface wave plasma microwave, and the surface wave plasma generating antenna 81 is provided with slots through which a microwave is radiated. The details of the surface wave plasma generating antenna 81 will be provided later.

The antenna unit 43 further includes a wave retardation member 82 provided on the top surface of the surface wave plasma generating antenna 81. A cylindrical member 82a made of a conductor is extended through the center of the wave retardation member 82 to connect the bearing 67 and the surface wave plasma generating antenna 81. Accordingly, the inner conductor 53 is connected to the surface wave plasma generating antenna 81 via the bearing 67 and the cylindrical member 82a. The lower end of the outer conductor 52 is extended to the surface wave plasma generating antenna 81, and the vicinity of the wave retardation member 82 is covered by the outer conductor 52. The surface wave plasma generating antenna 81 and a ceiling plate 83 to be described later are covered by a coating conductor 84.

The wave retardation member 82 has a dielectric constant greater than that of vacuum and is made of quartz, ceramic, a fluorine-based resin or a polyimide-based resin. As an example of the fluorine-based resin, polytetrafluoroethylene or the like may be employed. The wave retardation member 82 serves to reduce a size of the antenna by shortening the wavelength of the microwave because the wavelength of the microwave is increased in the vacuum. The wave retardation member 82 can adjust the phases of the microwaves depending on its thickness. By adjusting the thickness of the wave retardation member 82 such that an antinode of the standing wave is formed at the surface wave plasma generating antenna 81, it is possible to maximize the radiation energy of the surface wave plasma generating antenna 81 while minimizing the reflection.

A dielectric member for vacuum sealing, e.g., the ceiling plate 83 made of quart, ceramic or the like, is provided at a further leading end side of the surface wave plasma generating antenna 81. The microwave amplified by the main amplifier 47 passes through the gap between peripheral walls of the inner conductor 53 and the outer conductor 52, and then is radiated into the space in the chamber 1 through the ceiling plate 83.

In the present embodiment, the main amplifier 47, the tuner 60, and the surface wave plasma generating antenna 81 are arranged close to one another. Further, the tuner 60 and the surface wave plasma generating antenna 81 form a lumped constant circuit within ½ wavelength. Moreover, the surface wave plasma generating antenna 81, the wave retardation member 82, and the ceiling plate 83 are set to have a combined resistance of about 50 Ω. Therefore, the tuner 60 can directly tune the plasma load and effectively transmit an energy to the plasma.

The components in the surface wave plasma processing apparatus 100 are controlled by a control unit 110 including a micro processor. The control unit 110 includes a display, an input device, and a storage unit for storing process sequences of the surface wave plasma processing apparatus 100 and process recipes as control parameters, and the like. The control unit 110 controls the plasma processing apparatus in accordance with a selected process recipe.

(Configuration of Surface Wave Plasma Generating Antenna)

Hereinafter, the configuration of the surface wave plasma generating antenna 81 will be described.

(Surface Wave Plasma Generating Antenna of First Embodiment)

Figure 7:
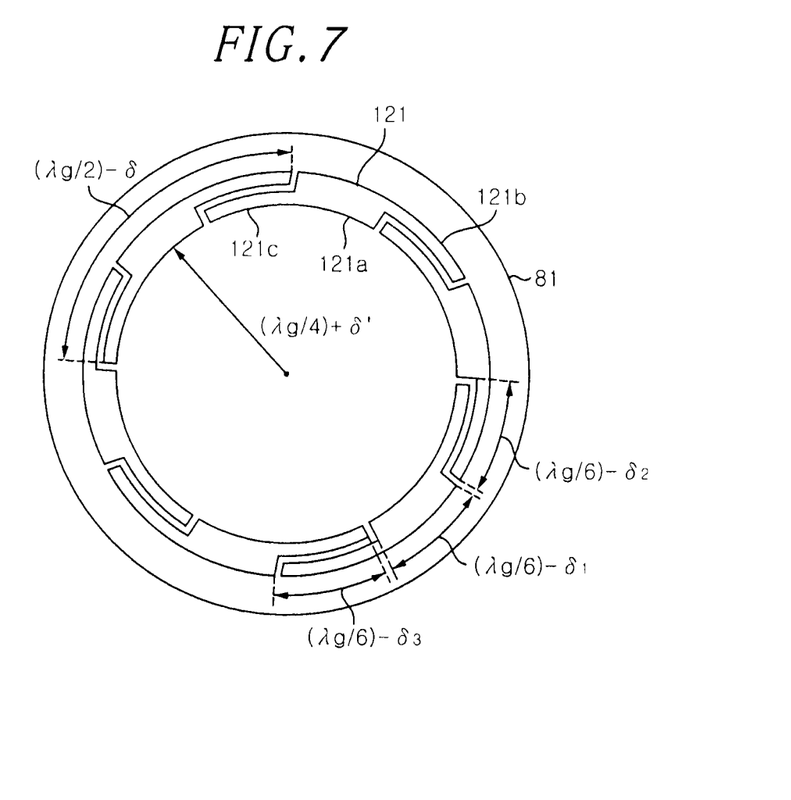
FIG. 7 is a plan view of a surface wave plasma generating antenna in accordance with a first embodiment of the present invention.

FIG. 7 is a plan view showing the surface wave plasma generating antenna in accordance with a first embodiment of the present invention. In the present embodiment, the surface wave plasma generating antenna 81 is entirely formed in a circular plate shape (planar shape), in which six slots 121 are arranged in a circumferential shape. All the slots 121 are formed in a same circular arc shape, and each of the slots 121 has a central portion 121a formed in a thick circular arc shape; and a first and a second end portion 121b and 121c extending in a circular arc shape from opposite circumferential end portions of the central portion 121a.

In each joint portion between the adjacent slots 121, a first end portion 121b of one slot 121 is overlapped with a second end portion 121c of the other slot 121 in a diametrical direction. In other words, the joint portion between the circumferentially adjacent slots is overlapped with the slots in a diametrical direction, and a portion where no slot is formed does not exist in the circumferential direction. Diametrical widths of the first end portion 121b and the second end portion 121c are set to be equal to or smaller than a half of a diametrical width of the central portion 121a. The first end portion 121b extends in a circumferential direction from an outer side (outer periphery side) of one circumferential end portion of the central portion 121a, and the second end portion 121c extends in a circumferential direction from an inner side (inner periphery side) of the other circumferential end portion of the central portion 121a.

Moreover, an outer periphery of the first end portion 121b is extended from the outer periphery of the central portion 121a, and an inner periphery of the second end portion 121c is extended from the inner periphery of the central portion 121a. Therefore, in the joint portion between the adjacent slots 121, the first end portion 121b and the second end portion 121c are overlapped with each other such that the first end portion 121b is positioned at the outer side and the second end portion 121c is positioned at the inner side. The six slots 121 entirely form a circular ring-shaped region having a uniform width. An outer and an inner periphery of the circular ring-shaped region respectively coincide with a line connecting the outer peripheries of the central portion 121a and the first end portions 121b and a line connecting the inner peripheries of the central portion 121a and the second end portions 121c.

Each of the slots 121 has a length of $(\lambda g/2)-\delta$, where $\lambda g$ represents an effective wavelength of a microwave, and $\delta$ represents a fine control component (including 0) which performs fine control such that the uniformity of the electromagnetic field intensity is increased in the circumferential direction (angular direction). Each length of the slots 121 is not limited to about $\lambda g/2$, and may be obtained by subtracting the fine control component (including 0) from an integer multiple of $\lambda g/2$. The central portion 121a, the first end portion 121b, and the second end portion 121c have substantially the same length.

In other words, when the length of each of the slots 121 is about $(\lambda g/2)-\delta$, the lengths of the central portion 121a, the first end portion 121b and the second end portion 121c are respectively set to about $(\lambda g/6)-\delta_1$, $(\lambda g/6)-\delta_2$ and $(\lambda g/6)-\delta_3$, where $\delta_1$, $\delta_2$ and $\delta_3$ represent fine control components (including 0) which perform fine control such that the uniformity of the electromagnetic field intensity is increased in the circumferential direction (angular direction). Since the overlapped portions of the adjacent slots preferably have the same length, $\delta_2$ is preferably equal to $\delta_3$. In the present embodiment, a length of a single slot 121 is about $\lambda g/2$, so that a total length of six slots is about $3\lambda g$. Since, however, the length of the overlapped portions is $(\lambda g/6)\times 6=\lambda g$, the total length becomes about $2\lambda g$. Therefore, this antenna has substantially the same radiation efficiency as that of a conventional antenna in which four slots having a length of about $\lambda g/2$ are arranged in a circumferential shape.

The slots 121 are arranged such that the inner peripheries thereof are separated from the center of the surface wave plasma generating antenna 81 by a distance of about $(\lambda g/4)+\delta'$, where $\delta'$ represents a fine control component (including 0) which performs fine control such that the diametrical distribution of the electromagnetic field intensity becomes uniform. The distance between the center and each of the inner peripheries of the slots is not limited to about $\lambda g/4$, and may be obtained by adding the fine control component (including 0) to an integer multiple of $\lambda g/4$.

(Surface Wave Plasma Generating Antenna of Second Embodiment)

Figure 8:
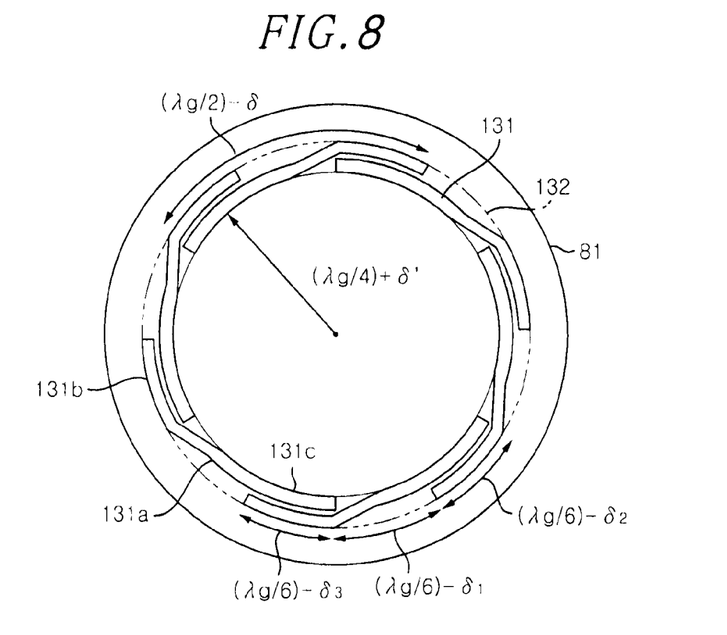
FIG. 8 is a plan view of a surface wave plasma generating antenna in accordance with a second embodiment of the present invention.

FIG. 8 is a plan view showing the surface wave plasma generating antenna in accordance with a second embodiment of the present invention. In the present embodiment, the surface wave plasma generating antenna 81 is formed in a circular plate shape (planar shape) as a whole, and six slots 131 are arranged in a circumferential shape as a whole. All the slots 131 are formed in a same thin and long shape along the circumference. In each joint portion between the adjacent slots 131, an end portion of one slot 131 and an end portion of the other slot 131 are overlapped with each other. In other words, the joint portion between the circumferentially adjacent slots is overlapped with the slots in a diametrical direction, and a portion where no slot is formed does not exist in the circumferential direction.

Specifically, each of the slots 131 has a first end portion 131b and a second end portion 131c which are respectively overlapped with the slots 131 adjacent to the corresponding slot 131 at opposite end portions thereof; and a central portion 131a where the first end portion 131b and the second end portion 131c are not overlapped with each other. Further, in each of the adjacent slots 131, the first end portion 131b of one slot and the second end portion 131c of the other slot are overlapped with each other such that the first end portion 131b is positioned outwardly of the second end portion 131c and the second end portion 131c is positioned inwardly of the first end portion 131b. The central portion 131a is obliquely disposed to connect the first end portion 131b positioned at the outer side and the second end portion 131c positioned at the inner side. In other words, each of the central portions 131a is obliquely disposed to connect the corresponding first end portion 131b partially coinciding with an outer periphery of a circular ring-shaped region 132 and the corresponding second end portion 131c partially coinciding with an inner periphery thereof. The circular ring-shaped region 132 is indicated by a dashed double-dotted line and contains therein the six slots 131 shown in FIG. 8.

As in the case of the slots 121 of the first embodiment, each of the slots 131 has a length of about $(\lambda g/2)-\delta$. $\lambda g$ and $\delta$ represent the same as those in the first embodiment. In this embodiment as well, the length of each of the slots 131 is not limited to about $\lambda g/2$, and may be obtained by subtracting the fine control component (including 0) from an integer multiple of $\lambda g/2$. The central portion 131a, the first end portion 131b, and the second end portion 131c have substantially the same length as in the case of those of the first embodiment.

In other words, when the length of each of the slots 131 is about $(\lambda g/2)-\delta$, the lengths of the central portion 131a, the first end portion 131b, and the second end portion 131c are respectively set to about $(\lambda g/6)-\delta_1$, $(\lambda g/6)-\delta_2$, and $(\lambda g/6)-\delta_3$, where $\delta_1$, $\delta_2$, and $\delta_3$ are the same as those in the first embodiment. Further, the overlapped portions of the adjacent slots preferably have the same length, so that $\delta_2$ is preferably equal to $\delta_3$. As in the case of the slots 121 of the first embodiment, a length of a single slot 131 of the present embodiment is about $\lambda g/2$. The number of slots is six, so that the total length is about 3λg. Since, however, the length of the overlapped portions is (λg/6)×6=µg, the total length becomes about 2λg. Therefore, this antenna also has substantially the same radiation efficiency as that of a conventional antenna in which four slots having a length of about λg/2 are arranged in a circumferential shape.

As in the case of the slots 121 of the first embodiment, the slots 131 are arranged such that the inner peripheries thereof (the inner periphery of the circular ring-shaped region 132) are separated from the center of the surface wave plasma generating antenna 81 by a distance of about (λg/4)+δ'. The distance from the center to each of the inner peripheries of the slots is not limited to about λg/4, and may be obtained by adding a fine control component (including 0) to an integer multiple of λg/4.

(Surface Wave Plasma Generating Antenna of Third Embodiment)

Figure 9:
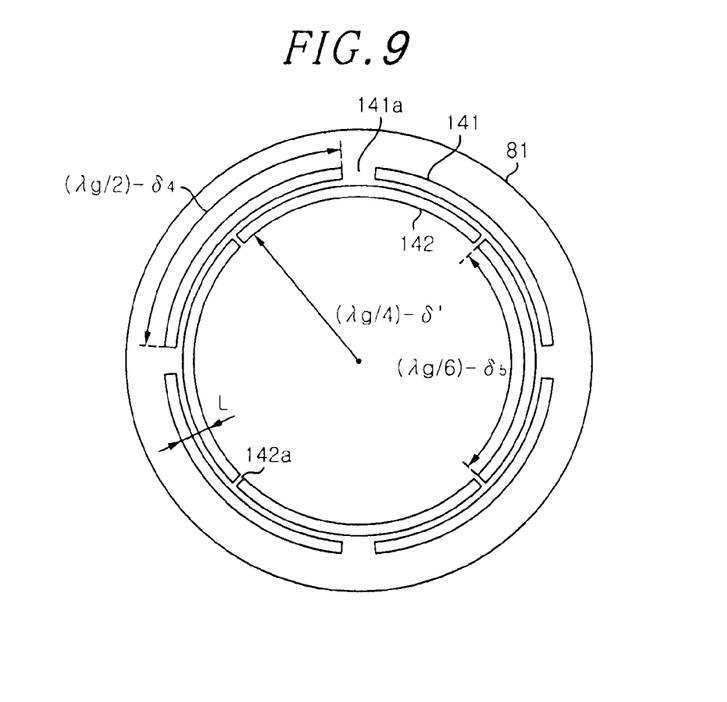
FIG. 9 is a plan view of a surface wave plasma generating antenna in accordance with a third embodiment of the present invention.

FIG. 9 is a plan view showing the surface wave plasma generating antenna in accordance with a third embodiment of the present invention. In the present embodiment, the surface wave plasma generating antenna 81 is entirely formed in a circular plate shape (planar shape) in which four circular arc-shaped slots 141 are formed in a circumferential shape to be spaced from each other at a predetermined interval and four circular arc-shaped slots 142 are formed therein in a circumferential shape to be spaced apart from each other at a predetermined interval.

Each length L from the outer peripheries of the outer slots 141 to the inner peripheries of the inner slots 142 is substantially equal to that of the four conventional slots arranged in a circumferential shape. A frame portion 141a (joint portion) between the outer slots 141 is not overlapped with a frame portion 142a (joint portion) between the inner slots 142. In other words, the joint portion between the circumferentially adjacent slots is overlapped with the corresponding slot in a diametrical direction, and at least a partial part of the outer slots 141 or the inner slots 142 exists in the circumferential direction. In FIG. 9, each frame portion 141a between the adjacent outer slots 141 is positioned at the center of the inner slot 142, and each frame portion 142a between the adjacent inner slots 142 is positioned at the center of the outer slot 141.

Each of the slots 141 has a length of about (λg/2)−δ$_4$, and each of the slots 142 has a length of about (λg/2)−δ$_5$, wherein δ$_4$ and δ$_5$ represent fine control components (including 0) which perform fine control such that the uniformity of the electric field intensity is increased in the circumferential direction (angular direction). The lengths of the slots 141 and 142 are not limited to about λg/2, and may be obtained by subtracting the fine control component from an integer multiple of λg/2.

As in the case of the slots 121 of the first embodiment, the slots 141 and 142 are arranged such that the inner peripheries of the inner slots 142 are separated from the center of the surface wave plasma generating antenna 81 by a distance of about (λg/4)+δ'. The distance from the center to each of the inner peripheries of the slots is not limited to about λg/4, and may be obtained by adding the fine control component (including 0) to an integer multiple of λg/4.

(Operation of Surface Wave Plasma Processing Apparatus)

Hereinafter, an operation of the surface wave plasma processing apparatus 100 configured as described above will be explained.

First, a wafer W is loaded into the chamber 1 and mounted on the susceptor 11. A plasma gas, e.g., Ar gas, is introduced from the plasma gas supply source 27 into the chamber 1 through the line 28 and the plasma gas introducing member 26. In that state, a microwave is introduced from the microwave plasma source 2 into the chamber 1, thereby generating a surface wave plasma.

After the surface wave plasma is generated, a processing gas, e.g., an etching gas such as Cl$_2$ gas or the like, is injected from the processing gas supply source 25 into the chamber 1 through the line 24 and the shower plate 20. The injected processing gas is excited by a plasma passing through the space 23 of the shower plate 20 and is then turned into a plasma. A plasma process, e.g., an etching process, is performed on the wafer W by the plasma of the processing gas.

In order to generate the surface wave plasma, in the microwave plasma source 2, a microwave power oscillated by the microwave oscillator 32 of the microwave output section is amplified by the amplifier 33 and divided into a plurality of microwave powers by the divider 34. The divided microwave powers are transmitted to the microwave supply unit 40. In the microwave supply unit 40, the microwave powers are independently amplified by the main amplifier 47 constituting a solid state amplifier and are then supplied to the waveguide 44 of the microwave introducing mechanism 41. Accordingly, the impedance is automatically matched in the tuner 60 and, in a state where the power reflection substantially does not occur, the microwave powers are radiated into the chamber 1 through the surface wave plasma generating antenna 81 and the ceiling plate 83 of the antenna unit 43 and are then spatially combined therein.

Since the slag driving unit 70 is provided in an extension of the shaft of the waveguide 44 having a coaxial structure, the power supplied to the waveguide 44 of the microwave introducing mechanism 41 is started from the side surface thereof. In other words, when the microwave (electromagnetic wave) transmitted through the coaxial cable 56 reaches the first pole 92 of the power supply antenna 90 at the microwave power introduction port 55 provided at the side surface of the waveguide 44, the microwave (electromagnetic wave) propagates along the antenna main body 91 and is radiated from the second pole 93 disposed at the leading end of the antenna main body 91.

Further, the microwave (electromagnetic wave) propagating in the antenna main body 91 is reflected by the reflection portion 94 and combined with an incident wave, thereby generating a standing wave. When the standing wave is generated at the location of the power supply antenna 90, an induced magnetic field is generated along the outer wall of the inner conductor 53 and, thus, an induced electromagnetic field is generated. Due to such chain reactions, the microwave (electromagnetic wave) propagates in the waveguide 44 and is transmitted to the antenna unit 43.

At this time, in the waveguide 44, a maximum microwave (electromagnetic wave) power can be transmitted to the waveguide 44 having a coaxial structure by reflecting the microwave (electromagnetic wave) radiated from the power supply antenna 90 by the reflecting plate 58. In that case, the length from the power supply antenna 90 to the reflecting plate 58 is preferably set to be substantially a multiple of a half wavelength of λg/4 in order to effectively combine the microwave with the reflection wave.

A large-size isolator or a combiner is not necessary since a plurality of distributed microwaves is amplified individually by the main amplifier 47 constituting a solid state amplifier and radiated individually by the surface wave plasma generating antenna 81. Then, the individually radiated microwaves are combined in chamber 1.

The microwave introducing mechanism 41 is very compact because the antenna unit 43 and the tuner 60 are formed as one unit. Therefore, it is possible to make the microwave plasma source 2 compact. The main amplifier 47, the tuner 60 and the surface wave plasma generating antenna 81 are provided adjacent to one another. Especially, the tuner 60 and the surface wave plasma generating antenna 81 can constitute a lumped constant circuit. Moreover, a plasma load can be tuned with high precision by the tuner 60 by setting to about 50 Ω a combined resistance of the surface wave plasma generating antenna 81, the wave retardation member 82, and the ceiling plate 83.

The tuner 60 constitutes a slag tuner capable matching an impedance simply by moving the two slags 61a and 61b and thus is compact and has low loss. Since the tuner and the surface wave plasma generating antenna 81 adjacent to each other constitute a lumped constant circuit and function as a resonator, an impedance mismatch extending to the surface wave plasma generating antenna 81 can be solved with high precision, and such a mismatching portion can practically be used as a plasma space. Accordingly, plasma control can be performed with high precision by the tuner 60.

The driving transmission unit for driving the slags, the driving guide unit and the support unit are provided inside the inner conductor 53, so that the driving mechanism of the slags 61a and 61b can be scaled down and the microwave introducing mechanism 41 can also be scaled down.

As described above, the microwave supplied to the waveguide 44 of the microwave introducing mechanism 41 is radiated into the chamber 1 through the surface wave plasma generating antenna 81 and the ceiling plate 83 of the antenna unit 43. However, when a plurality of circular arc-shaped slots is uniformly formed at the surface wave plasma generating antenna 81 as in a prior art, the electromagnetic field intensity is decreased at the joint portions (beam portion) between the slots where no opening is formed, and the plasma density is decreased in proportion to the area of that portions.

Figure 10:
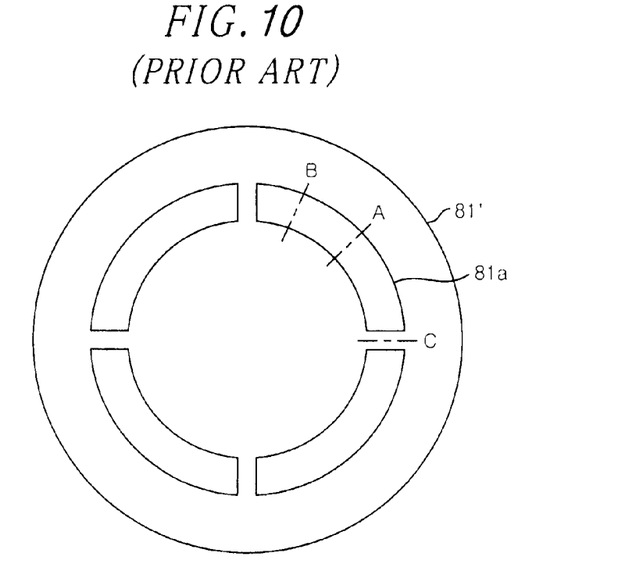
FIG. 10 is a plan view showing a plasma density measuring position in a conventional surface wave plasma generating antenna.
Figure 11:
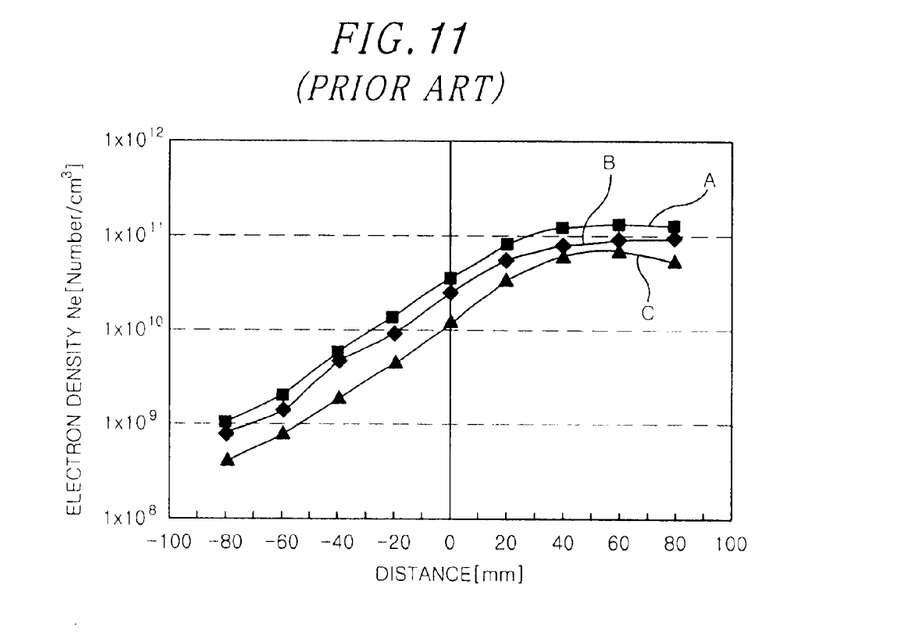
FIG. 11 shows plasma densities measured at a central portion of a slot, a portion between the center of the slot and a beam portion, and a portion immediately below the beam portion in the case of using the antenna shown in FIG. 10.

For example, in the case of a conventional surface wave plasma generating antenna 81' having four circular arc-shaped slots 81a uniformly arranged in a circumferential shape as shown in FIG. 10, the electromagnetic wave intensities are different at a central portion A of a slot 81a, a portion B between the center of the slot and a beam portion, and a beam portion C. Accordingly, the electromagnetic field therebelow is decreased and, thus, the plasma density is varied as shown in FIG. 11. In FIG. 11, a horizontal axis indicates a diametrical distance from the end portion of the quartz ceiling plate.

Figure 12:
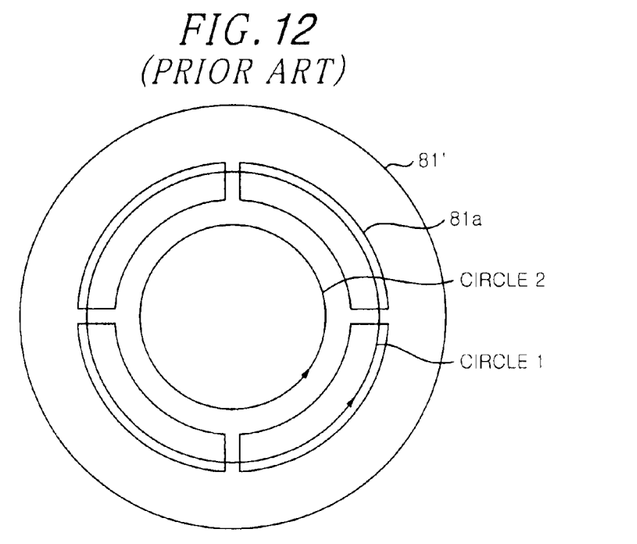
FIG. 12 shows circles 1 and 2 obtained by simulating electromagnetic field intensities in the circumferential direction of the conventional surface wave plasma generating antenna.
Figure 13:
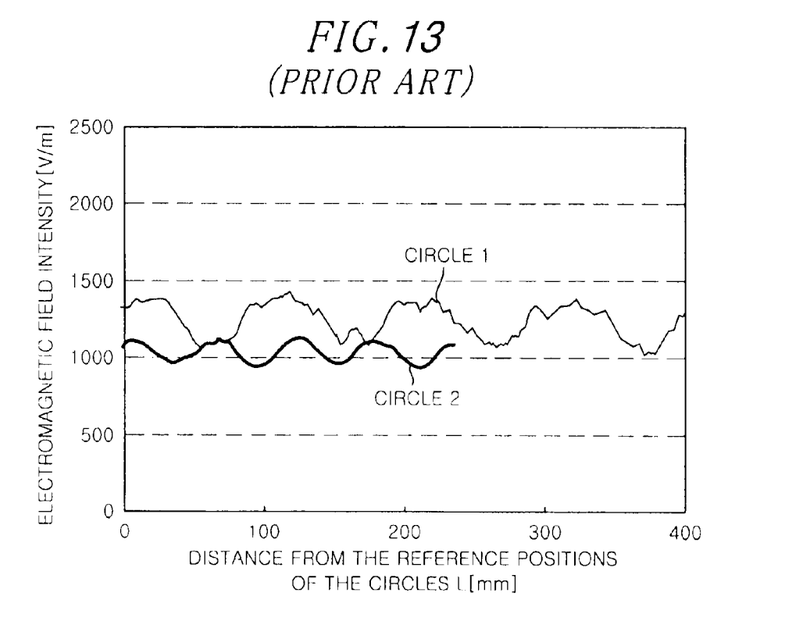
FIG. 13 shows distributions of the electromagnetic wave intensities in the circumferential direction of the circles 1 and 2 in the case of using the antenna shown in FIG. 12.

FIG. 13 shows electromagnetic field intensities obtained by electromagnetic simulation in the circles 1 and 2 illustrated in FIG. 12. The circle 1 shown in FIG. 12 is formed at an inner side of the outer peripheries of the slots 81a in a circumferential direction (angular direction), and the circle 2 is formed at the inner side of the inner peripheries of the slots 81a in the circumferential direction (angular direction). In FIG. 13, a horizontal axis represents a distance from the reference positions of the circles 1 and 2, and a vertical axis represents an electromagnetic field intensity obtained by electromagnetic simulation. As shown in FIG. 13, the electromagnetic field intensity is decreased at the beam portion between the slots, and this is true at the inner side of the slots.

Therefore, the surface wave plasma generating antenna 81 has the structure of the first to the third embodiment shown in FIGS. 7 to 9, and the joint portion between the circumferentially adjacent slots is overlapped with at least one of the slots such that a portion where no slot is formed does not exist in the circumferential direction. Accordingly, it is possible to prevent the electromagnetic field intensity at the joint portion from being decreased due to the absence of the slot and, thus, it is possible to make uniform the electromagnetic field intensity in the circumferential direction (angular direction). As a result, the uniform plasma density can be obtained.

Figure 14:
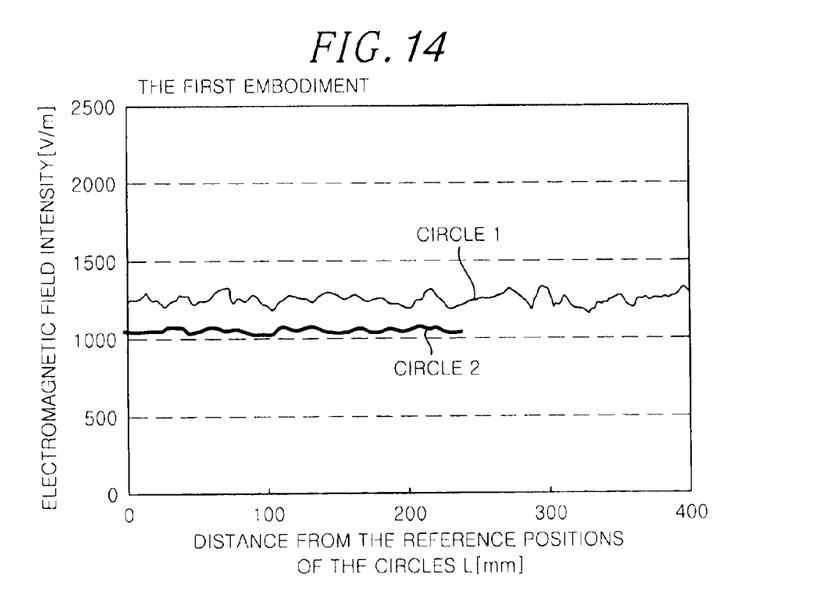
FIG. 14 shows distributions of electromagnetic wave intensities in the circumferential direction of the circles 1 and 2 in the case of using the surface wave plasma generating antenna in accordance with the first embodiment of the present invention which is shown in FIG. 7.
Figure 15:
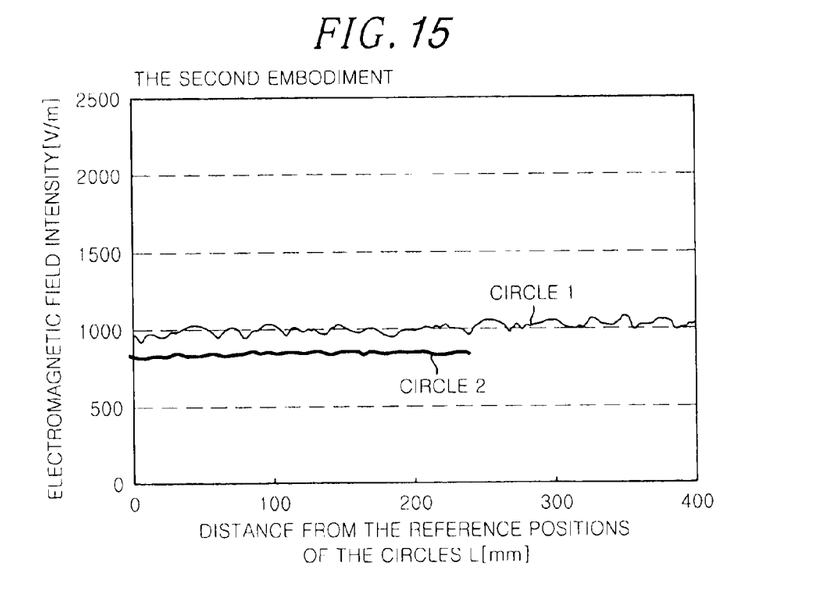
FIG. 15 shows distributions of electromagnetic field intensities in the circumferential direction of the circles 1 and 2 in the case of using a surface wave plasma generating antenna in accordance with a second embodiment of the present invention which is shown in FIG. 8.
Figure 16:
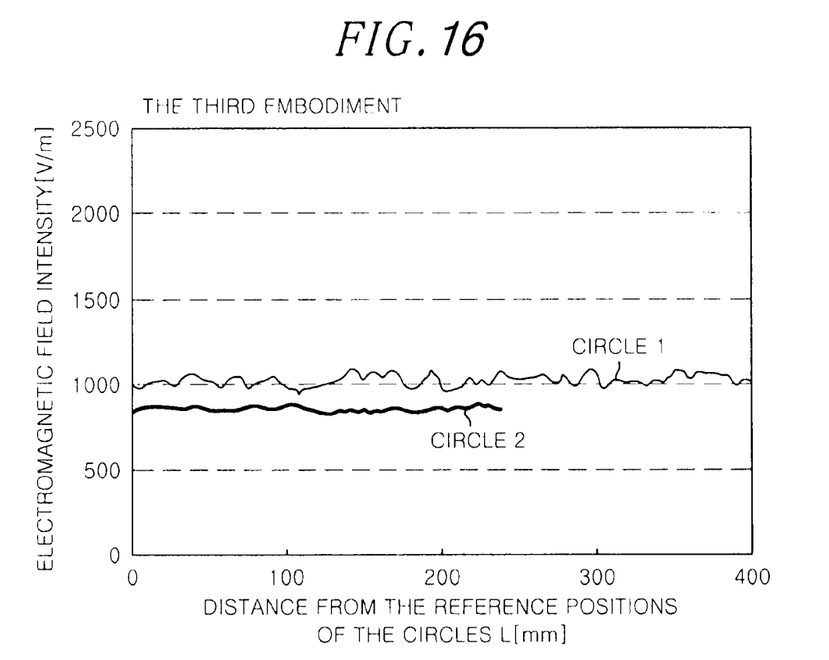
FIG. 16 shows distributions of electromagnetic field intensities in the circumferential direction of the circles 1 and 2 in the case of using a surface wave plasma generating antenna in accordance with a third embodiment of the present invention which is shown in FIG. 9.

FIGS. 14 to 16 show distributions of electromagnetic field intensities in a circumferential direction (angular direction) obtained by electromagnetic field simulation in the case of using the surface wave plasma generating antennas of the first to the third embodiment shown in FIGS. 7 to 9. In FIGS. 14 to 16, the electromagnetic field intensities in the circles 1 and 2 shown in FIG. 12 are illustrated. As shown in from FIGS. 14 to 16, when the surface wave plasma generating antennas of the first to the third embodiment is used, the electric field intensities in the circumferential direction (angular direction) become uniform.

The present invention is not limited to the above-described embodiments, and may be variously modified without departing from the scope of the present invention. For example, the configuration of the microwave output section 30 or the microwave supply unit 40 is not limited to that described in the above-described embodiments. Specifically, the phase shifter is not required when it is unnecessary to control the directivity of the microwave radiated from the antenna or to form a circularly polarized wave.

The shape, the number and the arrangement of the slots of the surface wave plasma generating antenna in the above-described embodiments are only examples and are not limited as long as a plurality of slots is arranged in a circumferential shape and a joint portion between adjacent slots is overlapped with at least one of the slots. Especially, the number of slots may be selected among natural numbers greater than or equal to 2.

In the above-described embodiments, the etching apparatus is used as the plasma processing apparatus. However, the plasma processing apparatus may be used for another plasma processing such as film formation, oxynitriding, ashing or the like without being limited thereto. Further, a target substrate to be processed is not limited to the semiconductor wafer W, and may be another substrate such as a FPD (flat panel display) represented by a LCD (liquid crystal display), a ceramic substrate or the like.

While the invention has been shown and described with respect to the embodiments, it will be understood by those skilled in the art that various changes and modifications may be made without departing from the scope of the invention as defined in the following claims.

What is claimed is:
1. A surface wave plasma generating antenna for generating a surface wave plasma in a chamber by radiating into the chamber a microwave transmitted from a microwave output section through a coaxial waveguide including an outer conductor and an inner conductor, the surface wave plasma generating antenna comprising:
 a planar shape member having a plurality of curved slots arranged along a circumferential direction and encircling a center of the planar shape member; wherein
 a joint portion of the planar shape member is formed by a radial separation between two circumferentially adjacent slots of the plurality of curved slots, wherein
 end portions of the two circumferentially adjacent slots are overlapped with each other in a diametrical direction at each joint portion such that, along an entirety of the circumferentially direction of the plurality of curved slots encircling the center of the planar shape member, a curved slot exists.
2. The surface wave plasma generating antenna of claim 1, wherein each of the plurality of curved slots has a central portion and a first and a second end portion extending from opposite sides of the central portion, and the first end portion of one of the two adjacent slots and the second end portion of the other slot of the two adjacent slots are overlapped with each other in a diametrical direction.

3. The surface wave plasma generating antenna of claim 2, wherein the central portion, the first end portion and the second end portion of each of the curved slots have substantially the same length.

4. The surface wave plasma generating antenna of claim 3, wherein
the central portion of each of the curved slots has a width,
each of the first and the second end portion thereof has a width equal to or smaller than a half of the width of the central portion,
the overlapped portion between the first end portion and the second end portion has a width same as the width of the central portion, and
a region where the curved slots are provided is formed in a circular ring shape.

5. The surface wave plasma generating antenna of claim 3, wherein each of the curved slots has a thin and long shape and the curved slots are provided in a circular ring-shaped region,
the first end portion of each of the curved slots is positioned outwardly of the second end portion of the curved slot adjacent thereto, and the second end portion is positioned inwardly of the first end portion of the other adjacent thereto, and
the central portion of each of the curved slots is obliquely disposed to traverse from the outer portion of the circular ring-shaped region to the inner portion thereof.

6. The surface wave plasma generating antenna of claim 5, wherein the first and the second end portion of each of the curved slots have a circular arc shape.

7. The surface wave plasma generating antenna of claim 2, wherein
the central portion of each of the curved slots has a width,
each of the first and the second end portion thereof has a width equal to or smaller than a half of the width of the central portion,
the overlapped portion between the first end portion and the second end portion has a width same as the width of the central portion, and
a region where the curved slots are provided is formed in a circular ring shape.

8. The surface wave plasma generating antenna of claim 2, wherein each of the curved slots has a thin and long shape and the curved slots are provided in a circular ring-shaped region, the first end portion of each of the curved slots is positioned outwardly of the second end portion of the curved slot adjacent thereto, and the second end portion is positioned inwardly of the first end portion of the other adjacent thereto, and the central portion of each of the curved slots is obliquely disposed to traverse from the outer portion of the circular ring-shaped region to the inner portion thereof.

9. The surface wave plasma generating antenna of claim 8, wherein the first and the second end portion of each of the curved slots have a circular arc shape.

10. A surface wave plasma generating apparatus comprising:
a chamber for accommodating therein a substrate to be processed;
a gas supply mechanism for supplying a gas into the chamber; and
a microwave plasma source for generating a surface wave plasma of the gas into the chamber by introducing a microwave into the chamber, the microwave plasma source including a microwave output section having a microwave power supply, for outputting a generated microwave; and a microwave introducing mechanism for introducing the outputted microwave into the chamber,
wherein the microwave introducing mechanism includes a coaxial waveguide having an outer conductor and an inner conductor; and
the surface wave plasma generating antenna, for radiating the microwave transmitted through the waveguide into the chamber, described in claim 1.

11. The surface wave plasma generating apparatus of claim 10, wherein
the microwave introducing mechanism further includes a tuner, provided in the waveguide, for matching an impedance of a load in the chamber to a characteristic impedance of the microwave power supply.

12. The surface wave plasma generating apparatus of claim 10, wherein the microwave introducing mechanism is provided in plural numbers.

13. The surface wave plasma generating apparatus of claim 11, wherein the microwave introducing mechanism is provided in plural numbers.

14. The surface wave plasma generating antenna of claim 2, wherein the first and the second end portion of each of the curved slots have a circular arc shape.

* * * * *